(12) United States Patent
Tangring (10) Patent No.: US 11,171,123 B2
(45) Date of Patent: Nov. 9, 2021

(54) METHOD OF PRODUCING AN OPTOELECTRONIC LIGHTING DEVICE AND OPTOELECTRONIC LIGHTING DEVICE

(71) Applicant: OSRAM Opto Semiconductors GmbH, Regensburg (DE)

(72) Inventor: Ivar Tangring, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/069,204

(22) PCT Filed: Jan. 12, 2017

(86) PCT No.: PCT/EP2017/050591
§ 371 (c)(1),
(2) Date: Jul. 11, 2018

(87) PCT Pub. No.: WO2017/121815
PCT Pub. Date: Jul. 20, 2017

(65) Prior Publication Data
US 2019/0019783 A1   Jan. 17, 2019

(30) Foreign Application Priority Data
Jan. 14, 2016   (DE) ..................... 10 2016 100 563.0

(51) Int. Cl.
*H01L 33/54*       (2010.01)
*H01L 25/075*      (2006.01)
(Continued)

(52) U.S. Cl.
CPC ........ *H01L 25/0753* (2013.01); *H01L 33/505* (2013.01); *H01L 33/54* (2013.01);
(Continued)

(58) Field of Classification Search
CPC .... H01L 25/0753; H01L 33/505; H01L 33/54
See application file for complete search history.

(56) References Cited

U.S. PATENT DOCUMENTS 6,495,862 B1   12/2002   Okazaki et al.
7,009,213 B2    3/2006   Camras et al.
(Continued)

FOREIGN PATENT DOCUMENTS

CN   101814487 A     8/2010
DE   195 27 026 A1   2/1997
(Continued)

OTHER PUBLICATIONS

First Office Action dated Jul. 8, 2020, of counterpart Chinese Application No. 201780017474.9, along with an English translation.

*Primary Examiner* — Trang Q Tran
(74) *Attorney, Agent, or Firm* — DLA Piper LLP (US)

(57) ABSTRACT

A method produces an optoelectronic lighting device. The device efficiently increases a decoupling of electromagnetic radiation from a volume emitter LED chip. This is achieved in that, a frame made of an optical material is provided on side surfaces of the volume emitter LED chip, wherein the frame has a curved section. Light decoupled via the side surfaces of the volume emitter LED chip is thereby coupled into the frame, and can be decoupled again via same or reflected, for example, on a reflective material applied to the frame.

20 Claims, 6 Drawing Sheets

(51) Int. Cl.
*H01L 33/50* (2010.01)
*H01L 33/58* (2010.01)
*H01L 33/60* (2010.01)

(52) U.S. Cl.
CPC .............. *H01L 33/58* (2013.01); *H01L 33/60* (2013.01); *H01L 2933/005* (2013.01); *H01L 2933/0041* (2013.01); *H01L 2933/0058* (2013.01)

(56) References Cited

U.S. PATENT DOCUMENTS

| | | |
|---|---|---|
| 7,276,737 B2 | 10/2007 | Camras et al. |
| 10,217,913 B2 | 2/2019 | Pindl et al. |
| 10,686,104 B2 | 6/2020 | Pindl et al. |
| 2006/0180925 A1* | 8/2006 | Lee ....................... H01L 33/642 |
| | | 257/717 |
| 2007/0170454 A1* | 7/2007 | Andrews ................. H01L 33/52 |
| | | 257/100 |
| 2012/0056229 A1 | 3/2012 | Chia-Liang |
| 2013/0328073 A1* | 12/2013 | Lowes .................. H01L 33/502 |
| | | 257/89 |
| 2015/0236203 A1* | 8/2015 | Oh et al. ....................... 257/717 |
| 2016/0240746 A1* | 8/2016 | Yun ....................... H01L 33/502 |

FOREIGN PATENT DOCUMENTS

| | | |
|---|---|---|
| DE | 10 2006 015 788 A1 | 9/2007 |
| DE | 10 2010 031 237 A1 | 1/2012 |
| DE | 11 2011 104 415 T5 | 9/2013 |
| DE | 10 2013 207 242 A1 | 10/2014 |
| DE | 10 2014 212 694 A1 | 1/2015 |
| DE | 10 2013 112 549 A1 | 5/2015 |
| JP | 2005-57266 A | 3/2005 |
| WO | 2013/017364 A2 | 2/2013 |
| WO | 2013/145071 A1 | 10/2013 |
| WO | 2015/071109 A1 | 5/2015 |

\* cited by examiner

METHOD OF PRODUCING AN OPTOELECTRONIC LIGHTING DEVICE AND OPTOELECTRONIC LIGHTING DEVICE

TECHNICAL FIELD

This disclosure relates to an optoelectronic lighting device and a method of producing an optoelectronic lighting device.

BACKGROUND

DE 10 2010 031 237 A1 describes in para [0031] that a sapphire volume emitter is known, for example, from DE 10 2006 015 788 A1. Para [0031] of DE 10 2010 031 237 A1 further explains that sapphire may be used as a growth substrate for a semiconductor layer sequence. In contrast to a thin-film chip, in the sapphire volume emitter, the growth substrate was not detached from the semiconductor layer sequence at the end of the production process. The (growth) substrate is radiation-transmissive to the radiation generated in an active zone of the semiconductor layer sequence.

Para [0031] of DE 10 2010 031 237 A1 further explains that in a volume emitter, in contrast to a surface emitter, a crucial radiation portion was coupled out from the semiconductor chip via the substrate as well.

Furthermore, electromagnetic radiation generated in a volume emitter is also coupled out via side faces of the substrate of the volume emitter.

It could therefore be helpful to provide an efficient way to couple out electromagnetic radiation from a volume emitter LED chip.

SUMMARY

I provide a method of producing an optoelectronic lighting device including providing one or a plurality of volume emitter LED chips, each including a substrate including a first side and a second side opposite the first side, wherein a semiconductor layer sequence including an active zone that generates electromagnetic radiation is arranged on the first side of the substrate, and the substrate is at least partly transmissive to the electromagnetic radiation generated, arranging the volume emitter LED chip(s) onto a mounting face of an optical component such that after the arranging, the second side of the respective substrate faces the mounting face and the first side of the respective substrate faces away from the mounting face, applying a curable, flowable, optical material on the mounting face to each form a diffluent frame at least partly enclosing the volume emitter LED chip or the plurality of volume emitter LED chips and contacting one or a plurality of respective side faces of the volume emitter LED chip or the plurality of volume emitter LED chips, and curing the respective frame to each form a cured frame at least partly enclosing the volume emitter LED chip or the plurality of volume emitter LED chips and contacting the one or the plurality of respective side faces, the frame including a curved section opposite the mounting face on account of the diffluence.

I also provide an optoelectronic lighting device including one or a plurality of volume emitter LED chips, each including a substrate including a first side and a second side opposite the first side, wherein a semiconductor layer sequence including an active zone that generates electromagnetic radiation is arranged on the first side of the substrate, and the substrate is at partly transmissive to the electromagnetic radiation generated, wherein the volume emitter LED chip(s) is (are) arranged on a mounting face of an optical component such that the second side of the respective substrate faces the mounting face and the first side of the respective substrate faces away from the mounting face, and in each case a cured frame at least partly enclosing the volume emitter LED chip or the plurality of volume emitter LED chips and contacting the one or the plurality of respective side faces is formed from an optical material, the frame including a curved section opposite the mounting face.

LIST OF REFERENCE SIGNS

101 First optoelectronic lighting device
102 Volume emitter LED chip
103 Substrate
105 First side of the substrate
107 Second side of the substrate
109 Semiconductor layer sequence
111 Mirror layer
113 Soldering pad
115 Lateral sidewall
117 Conversion layer
119 Side face
121 Top side of the volume emitter LED chip
123 Underside of the volume emitter LED chip
125 Cured frame
127 Curved section of the cured frame
128 Face of the cured frame
129 Reflective material
131 Optical component
133 Mounting face
135 Lens
137 Converted light
201 Second optoelectronic lighting device
203 Optical component
301 Third optoelectronic lighting device
501 Optical material
801 Providing
803 Arranging
805 Applying
807 Curing
901 Volume emitter LED chip
1001 Fourth optoelectronic lighting device

DETAILED DESCRIPTION

My method of producing an optoelectronic lighting device may comprise:
providing one or a plurality of volume emitter LED chips each comprising a substrate comprising a first side and a second side opposite the first side, wherein a semiconductor layer sequence comprising an active zone for generating electromagnetic radiation is arranged on the first side of the substrate, and the substrate is at least partly transmissive to the electromagnetic radiation generated, arranging the volume emitter LED chip(s) onto a mounting face of an optical component such that after the arranging the second side of the respective substrate faces the mounting face and the first side of the respective substrate faces away from the mounting face, applying a curable, flowable, optical material on the mounting face to form in each case a diffluent frame at least partly enclosing the volume emitter LED chip or the plurality of volume emitter LED chips and contacting one or a plurality of respective side faces of the volume emitter LED chip or the plurality of volume emitter LED chips, and curing the respective frame to form in each case a cured frame at least partly enclosing the volume emitter LED chip or the plurality of volume emitter LED chips and contacting the one or the plurality of respective side faces, the frame comprising a curved section opposite the mounting face on account of the diffluence.

My optoelectronic lighting device may comprise:

one or a plurality of volume emitter LED chips each comprising a substrate comprising a first side and a second side opposite the first side, wherein a semiconductor layer sequence comprising an active zone for generating electromagnetic radiation is arranged on the first side of the substrate, and the substrate is at least partly transmissive to the electromagnetic radiation generated, wherein the volume emitter LED chip(s) is (are) arranged on a mounting face of an optical component such that the second side of the respective substrate faces the mounting face and the first side of the respective substrate faces away from the mounting face, and in each case a cured frame at least partly enclosing the volume emitter LED chip or the plurality of volume emitter LED chips and contacting the one or the plurality of respective side faces is formed from an optical material, the frame comprising a curved section opposite the mounting face.

I form a frame around the volume emitter LED chip(s), the frame comprising a curved section. What is thus advantageously brought about is that electromagnetic radiation coupled out from the side faces may be reflected, in particular reflected in the direction of the optical component, at the curved section such that an efficient coupling-out of electromagnetic radiation from the volume emitter LED chip(s) may be brought about by this means.

I provide for the curved section to form on the basis of a self-regulating process. This is due to the fact that a flowable material is used, which, on account of its flowability, is diffluent after being applied on the mounting face. Consequently, the curved section forms automatically, without the need for active intervention for this purpose. Once the material is then cured, the curved section will no longer change and will become stable.

The use of the adjective "optical" in connection with the optical component and with the optical material means, in particular, that the material and/or respectively the component are/is at least partly, in particular completely, transmissive to electromagnetic radiation. In particular, the material and/or respectively the component are/is at least partly, in particular completely, transmissive to an electromagnetic radiation that is generated by the semiconductor layer sequence in the active zone.

"Partly transmissive" means, for example, a transmission for the electromagnetic radiation of at least 70%, in particular 80%, preferably 90%, for example, 95%, for example, 99%.

If the volume emitter LED chip comprises a conversion layer provided in the example, as will be explained below, then optical means, in particular, that the material and/or respectively the component are/is at least partly, in particular, completely, transmissive to the converted electromagnetic radiation.

A conversion layer is, in particular, a layer configured to convert a first wavelength or a first wavelength range of the electromagnetic radiation generated by the active zone into electromagnetic radiation comprising a second wavelength and/or respectively a second wavelength range. By way of example, the conversion layer comprises a phosphor.

"At least partly transmissive" comprises in particular the fact that a transmission for a wavelength of the generated or converted electromagnetic radiation is at least 70%, in particular 80%, for example, 90%, in particular 95%, for example, 99%. "At least partly transmissive" comprises in particular the wording "completely transmissive."

A reflective material may be applied on a face of the respective cured frame facing away from the mounting face.

This affords the technical advantage, in particular, that a luminous efficiency or a yield of electromagnetic radiation may be efficiently increased further. In particular, this affords the technical advantage that a coupling-out efficiency from the volume emitter LED chip(s) may be increased further in an efficient manner. This is because the reflective material thus brings about a more efficient reflection of the generated electromagnetic radiation and/or respectively the converted electromagnetic radiation.

On account of the curved section and the reflective material applied thereon, a reflector for the generated electromagnetic radiation and/or respectively for the converted electromagnetic radiation is thus advantageously formed. The curved section comprises a hyperbolic shape, for example.

A reflective material thus denotes in particular a material configured to reflect at least one subrange, in particular the complete wavelength range, of the generated and/or respectively converted electromagnetic radiation. A reflectance for the generated and/or respectively converted electromagnetic radiation is, for example, at least 70%, in particular at least 80%, for example, at least 90%, in particular at least 95%, for example, at least 99%.

The reflective material may be a polymer, in particular a silicone and/or, respectively, a reflective material comprising a polymer, in particular a silicone.

The reflective material may comprise an epoxy resin or be formed from an epoxy resin.

A reflective material comprises a plurality of scattering particles, for example. At such scattering particles what is advantageously brought about is that the generated and/or respectively converted electromagnetic radiation may be scattered.

Scattering particles are $TiO_2$ particles, for example.

By way of example, the reflective material is a mold compound or a potting compound in which scattering particles are embedded.

By way of example, the reflective material is configured to generate a white color impression. Such a reflective material may be designated in particular as a white reflective material.

A plurality of volume emitter LED chips may be provided and the optical component may comprise a plurality of lenses opposite the mounting face, wherein after curing the respective frame the volume emitter LED chips are singulated such that each volume emitter LED chip is provided with one or a plurality of dedicated lenses.

This affords the technical advantage, in particular, that an efficient optical imaging of the generated and/or respectively converted electromagnetic radiation may be brought about via the lenses.

A plurality of volume emitter LED chips may be provided, wherein the optical component comprises a plurality of lenses opposite the mounting face. In accordance with this example, the volume emitter LED chips are not singulated. Consequently, a multi-chip component is provided, wherein each volume emitter LED chip is assigned one or a plurality of dedicated lenses.

The optical component may be configured in a cuboid fashion.

This affords the technical advantage, in particular, that an efficient coupling-out of light or coupling-out of electromagnetic radiation from the volume emitter LED chip(s) may be brought about. The optical component configured in a cuboid fashion is formed as a lamina, for example.

The optical component may be formed from glass.

The optical component may be formed from silicone.

A plurality of volume emitter LED chips may be provided, wherein the optical component is configured in a cuboid fashion, and after curing the respective frame the volume emitter LED chips are singulated such that each volume emitter LED chip is provided with a dedicated optical component configured in a cuboid fashion.

The volume emitter LED chip or the plurality of volume emitter LED chips may each comprise a conversion layer arranged on the second side of the respective substrate and form the respective side face(s) of the volume emitter LED chip or the plurality of volume emitter LED chips.

This affords the technical advantage, in particular, that an efficient conversion of electromagnetic radiation may be brought about by the conversion layer. In accordance with the conversion layer specifically used, generation of desired converted wavelengths is thus advantageously made possible.

The optical material may be a polymer, in particular a silicone, and/or respectively comprises a polymer, in particular a silicone.

Providing a polymer, in particular a silicone, affords the technical advantage, in particular, that efficient applying and efficient curing are made possible. In particular, polymers and/or respectively silicones are technically handlable in a simple manner and generally cost-effective.

The respective substrate may be a sapphire substrate such that the volume emitter LED chip or the plurality of volume emitter LED chips is or are configured as sapphire volume emitter LED chips.

This affords the technical advantage, in particular, that the volume emitter LED chips may be produced efficiently.

The substrate may be a growth substrate for the semiconductor layer sequence. That is to say that the semiconductor layer sequence may be grown on the substrate, for example.

The optoelectronic lighting device may be and/or respectively is produced by the method of producing an optoelectronic lighting device.

Technical functionalities of the optoelectronic lighting device emerge analogously from corresponding technical functionalities of the method of producing an optoelectronic lighting device. That is to say therefore in particular that device features emerge from corresponding method features, and vice versa.

A reflective material may be applied on a face of the respective cured frame facing away from the mounting face.

The optical component may comprise a plurality of lenses opposite the mounting face such that singulating each volume emitter LED chip may be provided with one or a plurality of dedicated lenses.

The lens and/or respectively the lenses may be formed from glass. By way of example, the lens is formed as a glass sheet flat at one side and curved at another side opposite the one side, that is to say that the glass sheet has a lens curvature.

The volume emitter LED chip or the plurality of volume emitter LED chips may each comprise a conversion layer arranged exclusively on the second side of the respective substrate such that the respective side face(s) of the volume emitter LED chip or the plurality of volume emitter LED chips is (are) free of the conversion layer.

The optical material may comprise a phosphor. Consequently, the cured frame comprises the phosphor.

The conversion layer may comprise a phosphor.

The phosphor of the optical material may be different from the phosphor of the conversion layer. This affords the technical advantage, in particular, that the conversion layer and the cured frame may comprise different conversion properties.

If the sidewalls of the semiconductor layer sequence are provided with a phosphor, for example, the phosphor of the conversion layer or of the cured frame, this affords the technical advantage, in particular, that this spatial proximity of the phosphor to the semiconductor layer sequence brings about an efficient dissipation of thermal energy generated during operation of the volume emitter LED chip.

The optical material and the material from which the conversion layer is formed may be different materials. That is to say therefore in particular that the materials in which the respective phosphor is embedded may be different. In particular, they are the same materials.

The phosphor of the conversion layer may correspond to the phosphor of the optical material. That is to say therefore in particular that the conversion layer comprises the same phosphor as the optical material.

That is to say therefore in particular that the respective phosphors themselves may be different or identical.

The optical material may be a conversion matrix material. The conversion layer may comprise a conversion matrix material. The conversion matrix material of the conversion layer may be different from the conversion matrix material that has been and/or respectively is used as optical material. As a result, desired conversion properties may efficiently be achieved in an advantageous manner.

The respective phosphor may be embedded into the corresponding conversion matrix material. Consequently, the optical material may be a conversion matrix material comprising embedded phosphor. Consequently, the conversion layer may be formed from a conversion matrix material comprising embedded phosphor.

The wording "and/or respectively" comprises in particular the wording "and/or."

The above-described properties, features and advantages and the way in which they are achieved will become clearer and more clearly understood in association with the following description of examples explained in greater detail in association with the drawings.

Identical reference signs may be used hereinafter for identical features. Furthermore, for the sake of clarity, provision is made for not always depicting all reference signs for all of the elements in all of the drawings.

Figure 1:
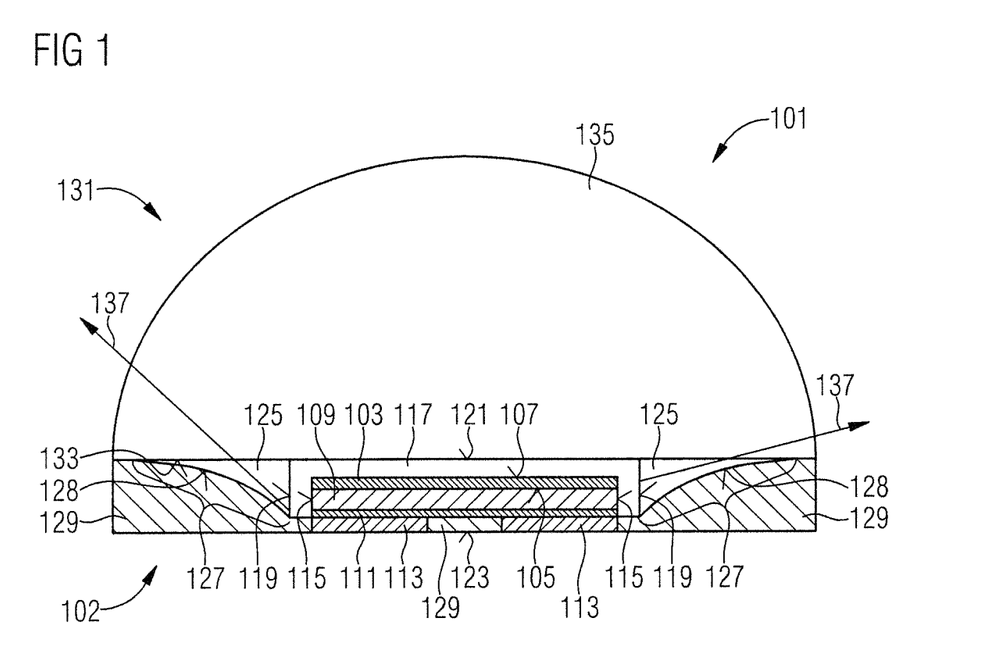
FIG. 1 shows a first optoelectronic lighting device.

FIG. 1 shows a first optoelectronic lighting device 101 in a lateral sectional view.

The optoelectronic lighting device 101 comprises a volume emitter LED chip 102. The volume emitter LED chip 102 comprises a substrate 103. The substrate 103 comprises a first side 105. The substrate 103 comprises a second side 107 opposite the first side 105. The substrate 103 is a sapphire substrate, for example. The volume emitter LED chip 102 is a sapphire volume emitter LED chip, for example.

A semiconductor layer sequence 109 is arranged on the first side 105 of the substrate 103, the semiconductor layer sequence comprising an active zone (not shown) that generate electromagnetic radiation.

A mirror layer 111 is arranged on the semiconductor layer sequence 109, by which mirror layer the generated electromagnetic radiation that radiates in the direction of the mirror layer 111 is reflected back in the direction of the substrate 103. The active zone (not shown) is thus located between the mirror layer 111 and the substrate 103.

Two mutually spaced apart and electrically insulated soldering pads 113 are arranged on the mirror layer 111. An electrical contacting of the semiconductor layer sequence 109 is brought about via the two soldering pads 113. The mirror layer 111 is configured to enable this electrical contacting via the two soldering pads 113. That is to say that an electrical contacting of the semiconductor layer sequence 109 is made possible by the mirror layer 111.

The volume emitter LED chip 102 comprises a conversion layer 117. The conversion layer 117 is arranged on opposite lateral sidewalls 115 of the semiconductor layer sequence 109, the mirror layer 111 and the substrate 103. That is to say that the conversion layer 117 extends as far as the lower edge of the mirror layer 111. The conversion layer 117 is furthermore arranged on the second side 107 of the substrate 103.

The conversion layer 117 thus forms opposite side faces 119 of the volume emitter LED chip 102.

The optoelectronic lighting device 101 furthermore comprises an optical component 131. The optical component 131 comprises a mounting face 133. The optical component 131 furthermore comprises a lens 135 opposite the mounting face 133.

The volume emitter LED chip 102 thus comprises a top side 121 formed by a face of the conversion layer 117 facing away from the second side 107 of the substrate 103.

The volume emitter LED chip 102 furthermore comprises an underside 123 opposite the top side 121 and formed at least partly by faces of the soldering pads 113 and of the conversion layer 117 that face away from the top side 121.

The volume emitter LED chip 102 is arranged by its top side 121 on the mounting face 133 of the optical component 131. By way of example, the volume emitter LED chip 102 is adhesively bonded on the mounting face 133.

On account of this arrangement, the second side 107 thus faces the mounting face 133.

The optoelectronic lighting device 101 furthermore comprises a frame 125 formed from a cured optical material that was flowable before the curing. The frame 125 contacts the side faces 119 of the volume emitter LED chip 102. Furthermore, the frame 125 encloses the volume emitter LED chip 102. The frame 125 is furthermore applied on the mounting face 133.

The cured frame 125 comprises a curved section 127. The curved section 127 is opposite the mounting face 133.

A reflective material 129 is applied on a face 128 of the curved section 127 and, generally, the frame 125 facing away from the mounting face 133. The reflective material 129 is, for example, a white silicone or epoxy resin, generally a white mold compound.

The reflective material 129 is applied, for example, by a mold process or mold method or a potting process. The reflective material 129 is applied such that it extends flush with the underside 123 of the volume emitter LED chip 102. Consequently, a planar underside is formed.

Two arrows with the reference sign 137 are depicted in FIG. 1 that symbolically show a light path of converted electromagnetic radiation. The light or beam path 137 shows that the converted electromagnetic radiation from the conversion layer 117 is coupled into the optical material, that is to say into the frame 125. Depending on the coupling-in and the original beam direction, the converted light 137 enters the lens 135 and from there emerges again from the lens 135. For the sake of clarity, a refraction of the converted light 137 on account of the lens 135 is not shown.

Depending on the originally coupled-in beam direction of the converted light, it may also be the case that this light or generally this electromagnetic radiation is reflected by the reflective material 129.

Consequently, an efficient coupling out of the electromagnetic radiation generated by the volume emitter LED chip 102 is advantageously brought about. This in particular compared to when the optical material, that is to say the frame 125 comprising its curved section 127, would be dispensed with, wherein only reflective material 129, that is to say, for example, white mold compound, would then be provided instead of the frame 125. This is because, in this case, the light or generally the electromagnetic radiation coupled out from the volume emitter LED chip 102 via the side faces 119 would be directly reflected back into the volume emitter LED chip 102 on account of the reflective material 129, as a result of which a coupling-out efficiency would decrease.

Figure 2:
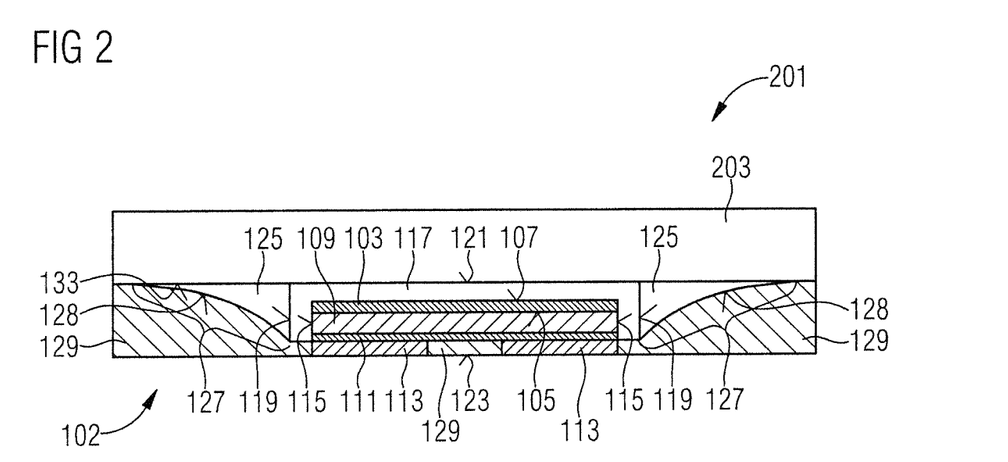
FIG. 2 shows a second optoelectronic lighting device.

FIG. 2 shows a second optoelectronic lighting device 201 in a lateral sectional view.

The optoelectronic lighting device 201 is formed substantially analogously to the first optoelectronic lighting device 101 from FIG. 1. As a difference, a different optical component 203 configured in a cuboid fashion is provided instead of the optical component 231. The optical component 103 is, for example, a transparent lamina comprising glass.

Figure 3:
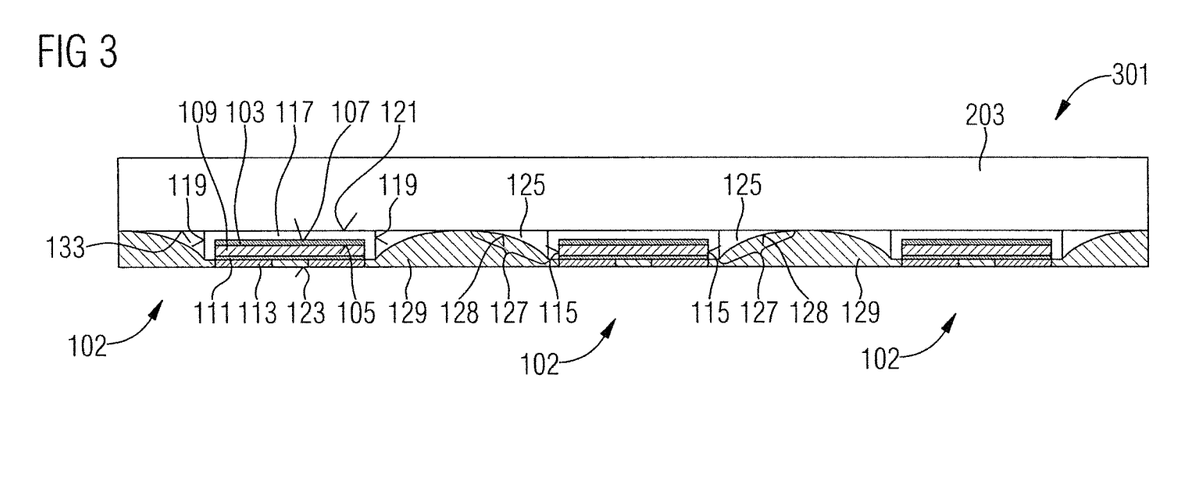
FIG. 3 shows a third optoelectronic lighting device.

FIG. 3 shows a third optoelectronic lighting device 301 in a lateral sectional view.

The optoelectronic lighting device 301 is configured substantially analogously to the second optoelectronic lighting device 201 from FIG. 2. As a difference, a plurality of volume emitter LED chips 102 are provided, which all comprise a common optical component 203, wherein the optical component 203 is configured in a cuboid fashion. In this regard, a so-called multi-chip package is provided or formed, for example.

FIGS. 4 to 7 respectively show a successive point in time in a method of producing an optoelectronic lighting device, here in particular to produce a plurality of optoelectronic lighting devices 101 in accordance with FIG. 1, in a lateral sectional view.

Figure 4:
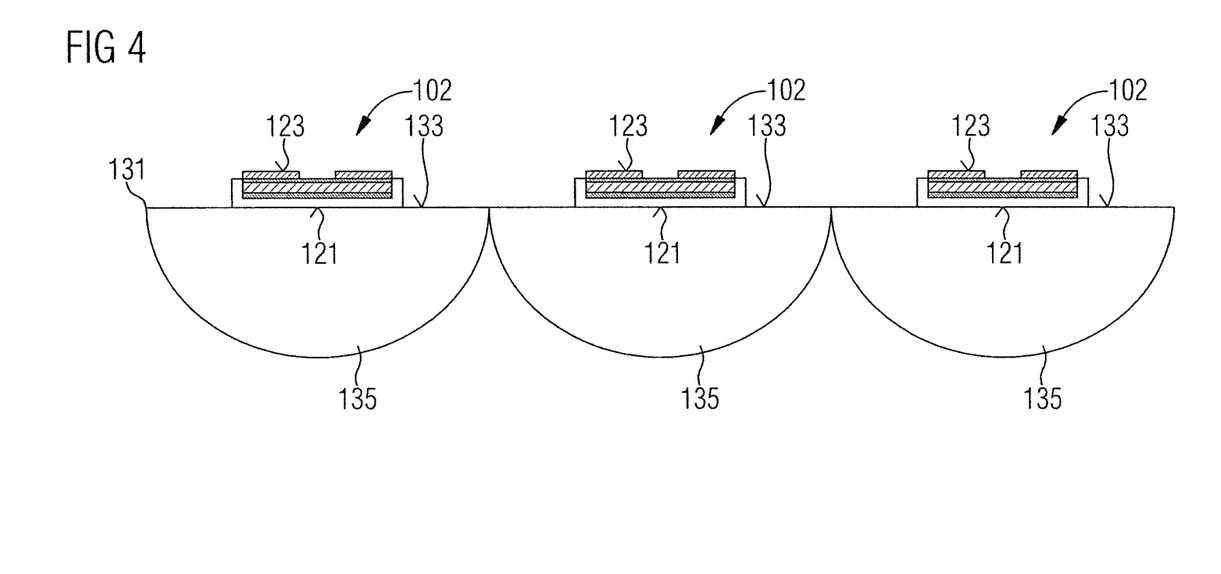
FIGS. 4 to 7, respectively, show a successive point in time in a method of producing an optoelectronic lighting device.

A first step shown in FIG. 4 provides for a plurality of volume emitter LED chips 102 to be arranged by their top side 121 onto a mounting face 133 of an optical component 131. The optical component 131 comprises a plurality of lenses 135 opposite the mounting face 133. Each volume emitter LED chip 102 is assigned a dedicated lens 135.

In particular, the volume emitter LED chips 102 are arranged onto the mounting face 133 such that an optical axis (not shown here) of the respective lens 135 extends through an axis of symmetry (not shown here) of the volume emitter LED chips 102.

By way of example, the volume emitter LED chips 102 are adhesively bonded onto the mounting face 133.

The optical component 131 is a molded component, for example. By way of example, the optical component 131 is an injection-molded component. If an optical component comprises a plurality of lenses, it may also be referred to as a lens array or an arrangement of lenses.

Figure 5:
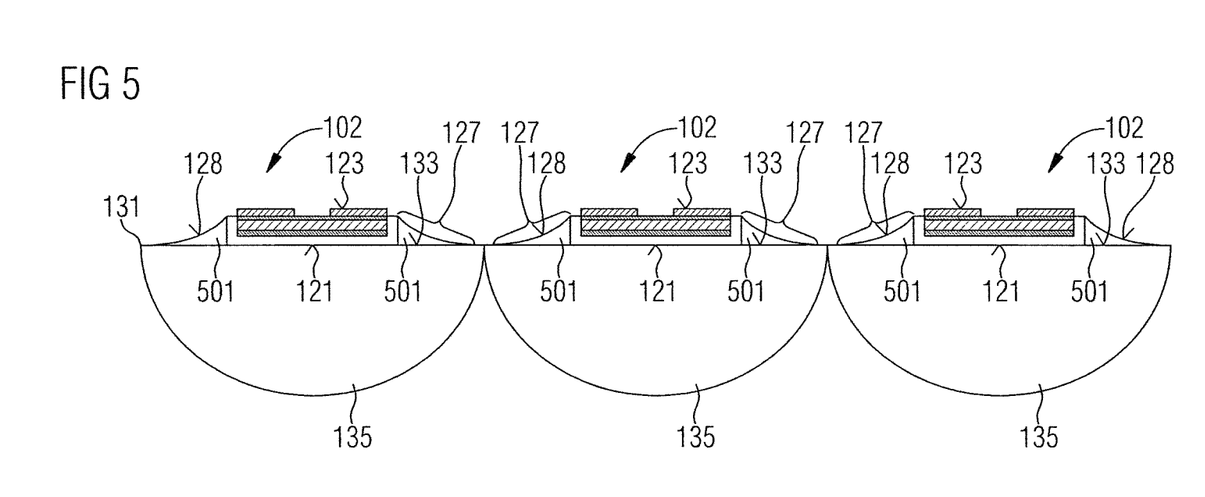

FIG. 5 shows a second step in the method of producing an optoelectronic lighting device, the second step temporally succeeding the first step. In accordance with the second step, a curable, flowable, optical material 501 is applied on the mounting face 133 to each form a frame enclosing the plurality of volume emitter LED chips 102. The frame contacts the side faces 119 of the respective volume emitter LED chips 102 and is diffluent on account of its flowability. Curing the curable and applied material 501 such that a frame 125 comprises a curved section 127 analogously to FIG. 1 is performed.

The optical material 501 is a clear silicone, for example.

Figure 6:
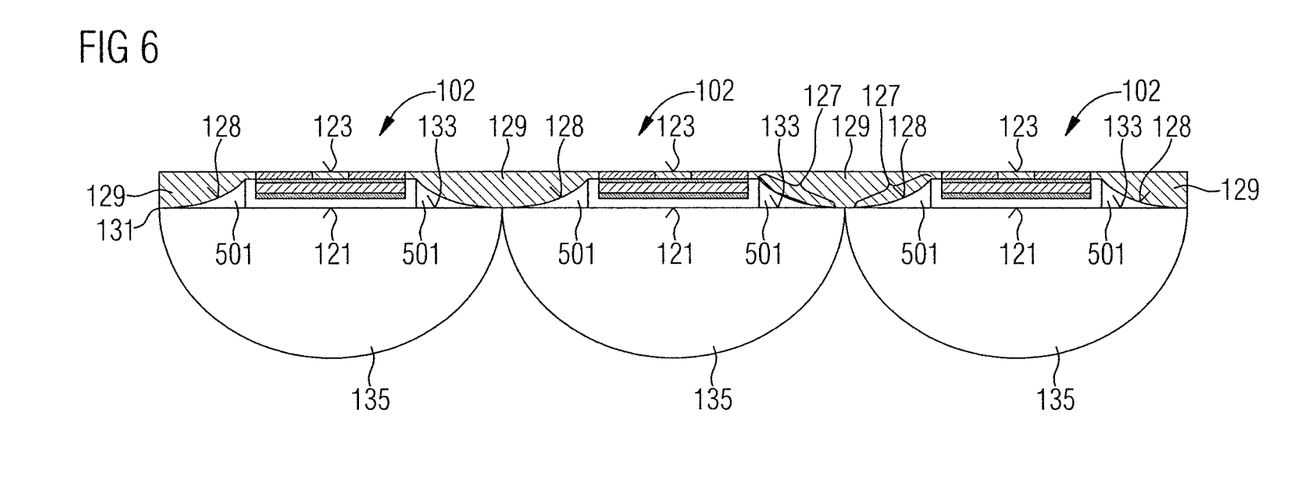

FIG. 6 shows a third point in time in a method of producing an optoelectronic lighting device, wherein the third point in time succeeds the second point in time. In accordance with this third step, the reflective material 129 is applied on the face 128. By way of example, the reflective material 129 is applied in the context of a mold process or a mold method or a potting process. In this case, the reflective material 129 is applied such that a flush underside arises.

Figure 7:
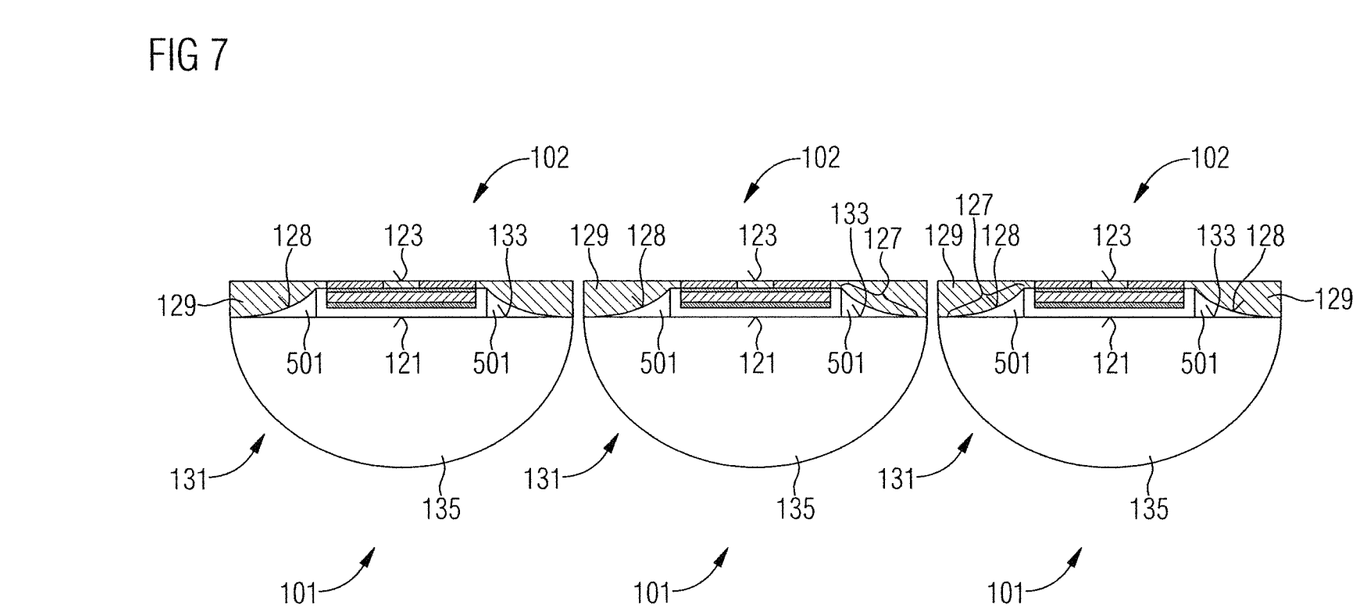

FIG. 7 shows a fourth point in time in a method of producing an optoelectronic lighting device, wherein the fourth point in time temporally succeeds the third point in time. In accordance with this fourth step, the plurality of volume emitter LED chips 102 are singulated such that a plurality of optoelectronic lighting devices 101 in accordance with FIG. 1 are produced.

Singulating comprises, for example, sawing and/or stamping and/or laser sawing.

Figure 8:
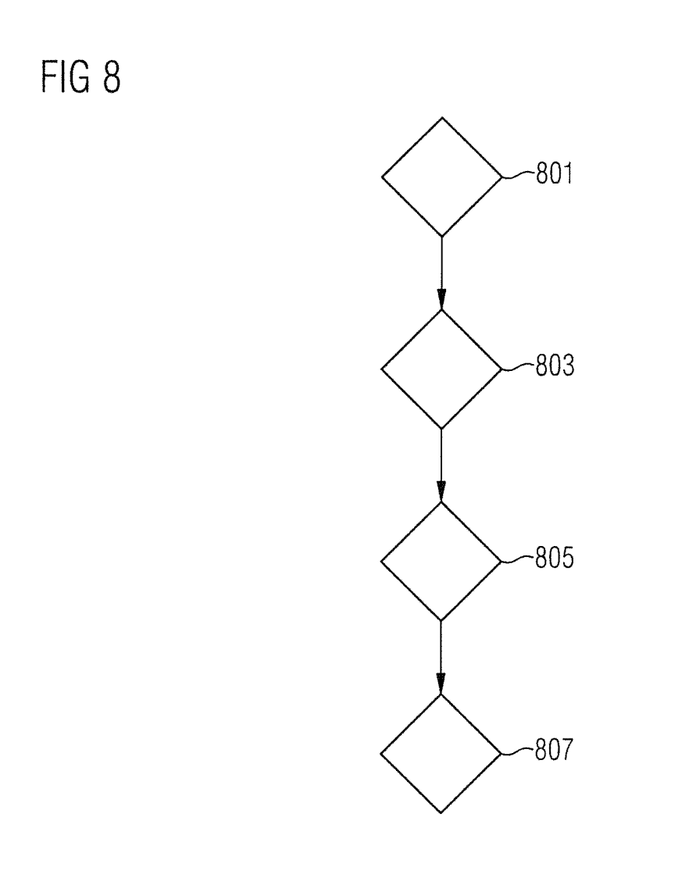
FIG. 8 shows a flow diagram of a method of producing an optoelectronic lighting device.

FIG. 8 shows a flow diagram of a method of producing an optoelectronic lighting device.

The method comprises:

providing 801 one or a plurality of volume emitter LED chips each comprising a substrate comprising a first side and a second side opposite the first side, wherein a semiconductor layer sequence comprising an active zone for generating electromagnetic radiation is arranged on the first side of the substrate, and the substrate is at least partly transmissive to the electromagnetic radiation generated, arranging 803 the volume emitter LED chip(s) onto a mounting face of an optical component such that after the arranging 803 the second side of the respective substrate faces the mounting face and the first side of the respective substrate faces away from the mounting face, applying 805 a curable, flowable, optical material on the mounting face to each form a diffluent frame at least partly enclosing, in particular completely enclosing, the volume emitter LED chip or the plurality of volume emitter LED chips and contacting one or a plurality of respective side faces of the volume emitter LED chip or the plurality of volume emitter LED chips, and curing 807 the respective frame to form in each case a cured frame at least partly enclosing the volume emitter LED chip or the plurality of volume emitter LED chips and contacting the one or the plurality of respective side faces, the frame comprising a curved section opposite the mounting face on account of the diffluence.

Since the curved section appears similar to a funnel and/or respectively may comprise a funnel shape, the curved section may also be referred to as a funnel section.

The curved section comprises, for example, a funnel shape.

Figure 9:
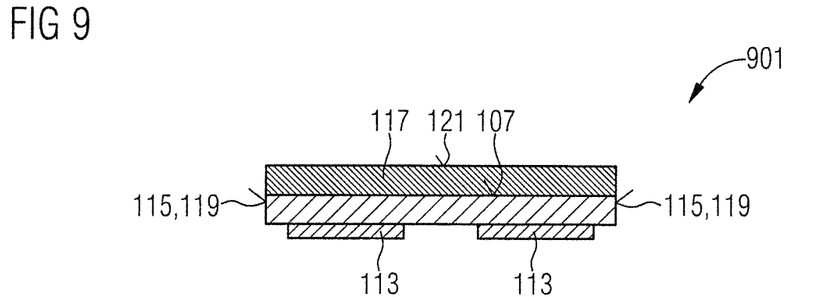
FIG. 9 shows a point in time in a method of producing an optoelectronic lighting device.

FIG. 9 shows a point in time in a method of producing an optoelectronic lighting device.

A volume emitter LED chip 901 is provided. The volume emitter LED chip 901 is configured substantially analogously to the volume emitter LED chip 102.

As a difference, in the volume emitter LED chip 901, the conversion layer 117 is not arranged on the lateral sidewalls 115 of the semiconductor layer sequence 109, of the mirror layer 111 and of the substrate 103. The conversion layer 117 of the volume emitter LED chip 901 is arranged exclusively on the second side 107 of the substrate 103.

The lateral sidewalls 115 free of the conversion layer 117 form opposite side faces 119 of the volume emitter LED chip 901.

Figure 10:
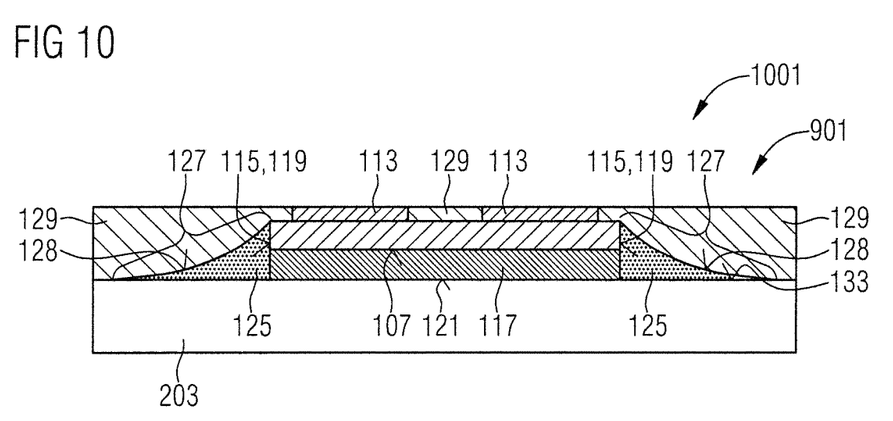
FIG. 10 shows a fourth optoelectronic lighting device.

FIG. 10 shows an optoelectronic lighting device 1001.

The optoelectronic lighting device 1001 was produced substantially analogously to the optoelectronic lighting device 102 from FIG. 2 in accordance with one example of the method.

As a difference, the volume emitter LED chip 901 in accordance with FIG. 9 was used rather than the volume emitter LED chip 102.

Furthermore, the optical material used to form the cured frame 125 comprises a phosphor. Consequently, the cured frame 125 comprises the phosphor and thus advantageously comprises a conversion function. That is to say that electromagnetic radiation emitted from the side faces 119 is converted in its wavelength by the phosphor of the cured frame 125.

In one example, the phosphor of the cured frame 125 is different from a phosphor comprised by the conversion layer 117. This affords the technical advantage, in particular, that the conversion layer 117 and the cured frame 125 may comprise different conversion properties.

To summarize, I provide an efficient technical concept that may efficiently increase a coupling-out of electromagnetic radiation from a volume emitter LED chip. This is due to the provision of a frame comprising an optical material at side faces of the volume emitter LED chip, wherein the frame comprises a curved section. Light coupled out through the side faces of the volume emitter LED chip is thus coupled into the frame and may couple out again through the latter or be reflected, for example, at a reflective material applied on the frame.

Although my methods and devices have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 100 563.0, the subject matter of which is incorporated herein by reference.

The invention claimed is:

1. An optoelectronic lighting device comprising:
one or a plurality of volume emitter LED chips, wherein each volume emitter LED chip comprises a substrate comprising a first side and a second side opposite the first side, wherein a semiconductor layer sequence comprising an active zone that generates electromagnetic radiation is arranged on the first side of the substrate, and the substrate is at least partly transmissive to the electromagnetic radiation generated by the active zone, wherein the volume emitter LED chip is or the plurality of volume emitter LED chips are directly arranged on a mounting face of an optical component such that the second side of the substrate of the volume emitter LED chip faces or the substrates of the plurality of volume emitter LED chips face the mounting face and the first side of the substrate faces away from the mounting face, in each case a cured frame is formed from an optical material, wherein the cured frame is at least partly enclosing the volume emitter LED chip or the plurality of volume emitter LED chips and contacting one or a plurality of side faces of the volume emitter LED chip or the plurality of volume emitter LED chips, the cured frame comprising a curved section opposite the mounting face, and the cured frame directly adjoins the one or the plurality of the side faces of the volume emitter LED chip or the plurality of volume emitter LED chips and the cured frame directly adjoins the mounting face, and wherein a reflective material is applied on a face of the curved section of the cured frame facing away from the mounting face.

2. The optoelectronic lighting device according to claim 1, wherein the optical component comprises a plurality of lenses opposite the mounting face such that, to singulate each volume emitter, the LED chip may be provided with one or a plurality of dedicated lenses.

3. The optoelectronic lighting device according to claim 1, wherein the optical component is configured in a cuboid shape.

4. The optoelectronic lighting device according to claim 1, wherein the volume emitter LED chip or the plurality of volume emitter LED chips each comprise a conversion layer arranged on the second side of the substrate and constituting the side face of the volume emitter LED chip or the plurality of volume emitter LED chips.

5. The optoelectronic lighting device according to claim 1, wherein the volume emitter LED chip or the plurality of volume emitter LED chips each comprise a conversion layer arranged exclusively on the second side of the substrate such that the side face(s) of the volume emitter LED chip or the plurality of volume emitter LED chips is (are) free of the conversion layer.

6. The optoelectronic lighting device according to claim 1, wherein the optical material comprises a phosphor.

7. The optoelectronic lighting device according to claim 1, wherein the mounting face of the optical component is flat.

8. The optoelectronic lighting device according to claim 1, wherein the cured frame mechanically contacts the one or the plurality of side faces.

9. The optoelectronic lighting device according to claim 1, wherein the curved section comprises a hyperbolic shape.

10. The optoelectronic lighting device according to claim 1, wherein the reflective material extends flush with the underside of the volume emitter LED chip.

11. The optoelectronic lighting device according to claim 3, wherein the volume emitter LED chip or the plurality of volume emitter LED chips each comprise a conversion layer arranged on the second side of the substrate and forming the side face of the volume emitter LED chip or the plurality of volume emitter LED chips.

12. The optoelectronic lighting device according to claim 1, wherein a reflective material is applied on a face of the respective cured frame that faces away from the mounting face, and the reflective material extends flush with an underside of the volume emitter LED chip forming a planar underside.

13. The optoelectronic lighting device according to claim 1, wherein a mirror layer is arranged on the semiconductor layer sequence, by which the generated electromagnetic radiation that radiates in the direction of the mirror layer is reflected back in the direction of the substrate, and two mutually spaced apart and electrically insulated soldering pads are arranged on the mirror layer.

14. A method of producing the optoelectronic lighting device according to claim 1 comprising:

providing one or a plurality of volume emitter LED chips, wherein each volume emitter LED chip comprises a substrate comprising a first side and a second side opposite the first side, wherein a semiconductor layer sequence comprising an active zone that generates electromagnetic radiation is arranged on the first side of the substrate, and the substrate is at least partly transmissive to the electromagnetic radiation generated by the active zone, arranging the volume emitter LED chip(s) directly onto a mounting face of an optical component such that after the arranging, the second side of the substrate of the volume emitter LED chip(s) faces the mounting face and the first side of the substrate faces away from the mounting face, applying a curable, flowable, optical material directly onto the mounting face to each form a diffluent frame at least partly enclosing the volume emitter LED chip or the plurality of volume emitter LED chips and contacting one or a plurality of side faces of the volume emitter LED chip or the plurality of volume emitter LED chips such that the optical material directly adjoins the one or the plurality of the side faces of the volume emitter LED chip, and curing the frame to each form a cured frame at least partly enclosing the volume emitter LED chip or the plurality of volume emitter LED chips and contacting the one or the plurality of side faces, said frame comprising a curved section opposite the mounting face on account of the diffluence, wherein a reflective material is applied on a face of the curved section of the cured frame facing away from the mounting face.

15. The method according to claim 14, wherein a plurality of volume emitter LED chips are provided, the optical component comprises a plurality of lenses opposite the mounting face, and after curing, the frame the volume emitter LED chips are singulated such that each volume emitter LED chip is provided with one or a plurality of dedicated lenses.

16. The method according to claim 14, wherein the optical component is configured in a cuboid shape.

17. The method according to claim 14, wherein the volume emitter LED chip or the plurality of volume emitter LED chips each comprise a conversion layer arranged on the second side of the substrate and form the respective side face(s) of the volume emitter LED chip or the plurality of volume emitter LED chips.

18. The method according to claim 14, wherein the volume emitter LED chip or the plurality of volume emitter LED chips each comprise a conversion layer arranged exclusively on the second side of the substrate such that the respective side face(s) of the volume emitter LED chip or the plurality of volume emitter LED chips is (are) free of the conversion layer.

19. The method according to claim 14, wherein the optical material comprises a phosphor.

20. An optoelectronic lighting device comprising:
one or a plurality of volume emitter LED chips, wherein each volume emitter LED chip comprises a substrate comprising a first side and a second side opposite the first side, a semiconductor layer sequence comprising an active zone that generates electromagnetic radiation is arranged on the first side of the substrate, and the substrate is at least partly transmissive to the electromagnetic radiation generated by the active zone,
wherein the volume emitter LED chip is or the plurality of volume emitter LED chips are directly arranged on a mounting face of an optical component such that the second side of the substrate of the volume emitter LED chip faces or the substrates of the plurality of volume emitter LED chips face the mounting face and the first side of the substrate faces away from the mounting face,
in each case a cured frame is formed from an optical material, wherein the cured frame is at least partly enclosing the volume emitter LED chip or the plurality of volume emitter LED chips and contacting one or a plurality of side faces of the volume emitter LED chip or the plurality of volume emitter LED chips and the cured frame directly adjoining the mounting face, the cured frame comprising a curved section opposite the mounting face, and
a reflective material is arranged on a face of the curved section of the cured frame facing away from the mounting face.

* * * * *